US009558959B2

(12) United States Patent
Mishra et al.

(10) Patent No.: US 9,558,959 B2
(45) Date of Patent: Jan. 31, 2017

(54) POLISHING COMPOSITIONS AND METHODS FOR SELECTIVELY POLISHING SILICON NITRIDE OVER SILICON OXIDE FILMS

(71) Applicant: Fujifilm Planar Solutions, LLC, Adrian, MI (US)

(72) Inventors: Abhudaya Mishra, Gilbert, AZ (US); Luling Wang, Mesa, AZ (US)

(73) Assignee: FUJIFILM PLANAR SOLUTIONS, LLC, Adrian, MI (US)

( * ) Notice: Subject to any disclaimer, the term of this patent is extended or adjusted under 35 U.S.C. 154(b) by 0 days.

(21) Appl. No.: 14/857,310

(22) Filed: Sep. 17, 2015

(65) Prior Publication Data

US 2016/0079080 A1  Mar. 17, 2016

Related U.S. Application Data

(62) Division of application No. 14/245,286, filed on Apr. 4, 2014.

(51) Int. Cl.
*H01L 21/3105* (2006.01)
*C09G 1/02* (2006.01)

(52) U.S. Cl.
CPC .......... *H01L 21/31053* (2013.01); *C09G 1/02* (2013.01); *H01L 21/31055* (2013.01)

(58) Field of Classification Search
None
See application file for complete search history.

(56) References Cited

U.S. PATENT DOCUMENTS 6,239,032 B1    5/2001  Nakamura et al.
6,561,876 B1 *  5/2003  Tateyama .......... H01L 21/31053
                                                       257/E21.244
6,776,810 B1    8/2004  Cherian
(Continued)

FOREIGN PATENT DOCUMENTS

WO    2007108923 A2    9/2007
WO    2007146065 A1    12/2007
(Continued)

OTHER PUBLICATIONS

Schlueter et al; "High Selectivity Silicon Nitride Slurry for Advanced Technology Node Front End CMP Applications"; Air Products and Chemicals Electronics Division; Aug. 12, 2013; pp. 1-14.

(Continued)

*Primary Examiner* — Allan Olsen
(74) *Attorney, Agent, or Firm* — Ohlandt, Greeley, Ruggiero & Perle, LLP

(57) ABSTRACT

Stable aqueous polishing compositions that can selectively polish silicon nitride (SiN) films and nearly stop (or polish at very low rates) on silicon oxide films are provided herein. The compositions comprise an anionic abrasive, a nitride removal rate enhancer containing a carboxyl or carboxylate group, water, and optionally, an anionic polymer. The synergistic combination of anionic (negatively charged) abrasives and the nitride removal rate enhancer provide beneficial charge interactions with the dielectric films during CMP, a high SiN rate and selectivity enhancement (over oxide), and stable colloidal dispersed slurries.

24 Claims, 4 Drawing Sheets

(56) References Cited

U.S. PATENT DOCUMENTS

| | | | |
|---|---|---|---|
| 6,866,793 B2* | 3/2005 | Singh | C09G 1/02 252/79.1 |
| 7,217,989 B2 | 5/2007 | Hiramitsu et al. | |
| 7,504,044 B2 | 3/2009 | Carter et al. | |
| 8,043,970 B2 | 10/2011 | Lee et al. | |
| 8,062,395 B2* | 11/2011 | Yi | C09G 1/02 51/307 |
| 8,822,340 B2* | 9/2014 | Babu | C09G 1/02 216/89 |
| 2002/0045350 A1 | 4/2002 | Kido et al. | |
| 2002/0182982 A1* | 12/2002 | Li | B24B 37/0056 451/41 |
| 2003/0036339 A1* | 2/2003 | Bonner | C09G 1/02 451/41 |
| 2004/0060502 A1* | 4/2004 | Singh | C09G 1/02 117/68 |
| 2004/0142640 A1* | 7/2004 | Prabhu | H01L 21/76229 451/41 |
| 2005/0233578 A1* | 10/2005 | Jia | B23H 5/08 438/633 |
| 2006/0030154 A1* | 2/2006 | MacDonald | H01L 21/31053 438/690 |
| 2007/0037892 A1* | 2/2007 | Belov | B24B 37/044 516/79 |
| 2007/0048991 A1 | 3/2007 | Shih et al. | |
| 2007/0254485 A1* | 11/2007 | Mao | B23H 5/08 438/692 |
| 2009/0130849 A1* | 5/2009 | Lee | B24B 37/044 438/693 |
| 2009/0215269 A1 | 8/2009 | Boggs | |
| 2009/0236559 A1* | 9/2009 | Brusic | B24B 37/044 252/79.1 |
| 2010/0035438 A1* | 2/2010 | Kamikubo | H01L 21/31053 438/759 |
| 2010/0167547 A1 | 7/2010 | Kamimura | |
| 2012/0161320 A1 | 6/2012 | Akolkar et al. | |
| 2013/0005219 A1 | 1/2013 | Takemura et al. | |
| 2013/0072021 A1* | 3/2013 | Cui | H01L 21/3212 438/693 |
| 2013/0146804 A1 | 6/2013 | Mizuno et al. | |
| 2015/0132955 A1* | 5/2015 | Yamato | H01L 21/31053 438/692 |
| 2015/0284593 A1* | 10/2015 | Wang | C09G 1/02 438/693 |
| 2016/0079080 A1* | 3/2016 | Mishra | C09G 1/02 438/693 |

FOREIGN PATENT DOCUMENTS

| | | |
|---|---|---|
| WO | 2009042072 A2 | 4/2009 |
| WO | 2009080443 A1 | 7/2009 |

OTHER PUBLICATIONS

Extended European Search Report dated Jul. 7, 2015 for European application No. 15158633.6.

* cited by examiner

POLISHING COMPOSITIONS AND METHODS FOR SELECTIVELY POLISHING SILICON NITRIDE OVER SILICON OXIDE FILMS

CROSS-REFERENCE TO RELATED APPLICATION

The present application claims priority to U.S. patent application Ser. No. 14/245,286, filed on Apr. 4, 2014, which is herein incorporated by reference.

BACKGROUND OF THE DISCLOSURE

1. Field of the Disclosure

The present disclosure relates to polishing compositions, and methods for polishing semiconductor substrates using the same. More particularly, this disclosure relates to polishing compositions and methods for selectively polishing silicon nitride films over other dielectric films in semiconductor substrates containing multiple dielectric and metal films.

2. Description of the Related Art

The semiconductor industry is continually driven to improve chip performance by further miniaturization of devices by process and integration innovations. Chemical Mechanical Polishing/Planarization (CMP) is a powerful technology as it makes many complex integration schemes at the transistor level possible, thereby increasing chip density. Not surprisingly, there are a multitude of new CMP steps and requirements at the Front End of Line (FEOL) transistor fabrication step. These steps are new CMP requirements; quite different from the traditional shallow trench isolation (STI) and oxide polishing steps. These "exotic" FEOL CMP steps and processes started gaining attention (when compared to Back End of Line (BEOL) CMP) after the introduction of high-k metal gate technology at 45 nm and FinFET technology at 22 nm chip production by the Intel Corporation. Particularly, in many of these advanced integration schemes, silicon nitride (SiN) films are used as an Etch stop layer, capping material, and Hard Mask. In addition, SiN is also used as a diffusion or passivation layer, spacer material, and additional liner. In all such schemes, the SiN is used in combination with other dielectric films such as silicon oxide (e.g., TEOS) and poly-silicon. Thus, the chip manufacturing steps involving such integration schemes require selective polishing or removal of SiN films without removing the other dielectric material (such as TEOS). Therefore, for such kind of CMP polishing steps, slurries with very high and selective removal of SiN to silicon oxide films are required as most patterned wafers contain both the dielectric films at different density and feature size.

Other schemes, in which a composition that selectively polishes SiN over silicon oxide (e.g., TEOS) is required, are the "Reverse STI processes" and replacement of "Classic Etch Back processes." In the language of the field, a SiN selective composition over silicon oxide implies a CMP composition that polishes SiN films at very high Material Removal Rates (MRRs) and simultaneously polishes silicon oxide at very low (and near to zero) MRRs thereby removing SiN selectively versus silicon oxide films. For example, a STI composition displays very high silicon oxide rates and very low SiN MRRs. Conversely, a "Reverse STI" composition displays very high SiN rates and very low silicon oxide MRRs, or, in other words, polishes SiN selectively versus silicon oxide films in pattern structures involving both the films.

The same properties are shown on blanket wafers which contain only an individual film—high SiN rates on blanket SiN wafers and low (to zero) oxide rates on blanket TEOS wafers. However, at times, the selectivity is higher on blanket wafers than observed on patterned wafers. In addition to Reverse STI processes, the SiN selective slurries are now being used in CMP processes that replace Etching processes in schemes involving removal of SiN by "Classic Etch Back processes." In such schemes, it is desirable to utilize CMP rather than Etching methods because CMP delivers better defectivity and higher planarity on the substrate surface; to meet the ever increasing stringent requirements of semiconductor manufacturing.

FIG. 1 displays two applications, as examples, in which the Reverse STI CMP composition is used to polish off the SiN layer and then stop on the Silicon Oxide layer. After this Reverse STI CMP step, the semiconductor substrate is further processed.

The present disclosure provides stable compositions that show very high selectivities of SiN to silicon oxide by achieving nearly zero silicon oxide MRRs. The main body of the disclosure discusses the unique technologies that distinguish this disclosure from prior art.

SUMMARY OF THE DISCLOSURE

The present disclosure relates to stable aqueous slurries that can selectively polish silicon nitride films and nearly stop (or polish at very low rates) on silicon oxide films. More particularly, the present disclosure relates to a polishing composition comprising an anionic abrasive, a nitride removal rate enhancer comprising a carboxyl or a carboxylate group, water, and optionally, an anionic polymer. The pH of the polishing composition is in the 2 to 6.5 range. The compositions of the present disclosure can also be diluted to form a polishing composition without any deterioration in performance on dilution. This disclosure also discusses methods for polishing semiconductor substrates using the aforementioned polishing compositions.

The synergistic use of a negatively charged (anionic) abrasive and the nitride removal rate enhancer having a carboxyl or carboxylate group in the same composition provides advantages not found in currently available slurries. Among others, these benefits are:

i) Beneficial Charge Interactions—the anionic abrasive, being negatively charged, repels the negatively charged silicon oxide wafer surface and is drawn toward the positively charged silicon nitride (SiN) wafer surface. The repulsion forces with silicon oxide wafers decrease the material removal rates (MRRs) of silicon oxide during polishing, and the attractive forces with the SiN wafer surface help in increasing the SiN MRRs. This generates a highly selective SiN:silicon oxide composition, in the 2 to 6.5 operating pH range.

ii) SiN rate and selectivity Enhancement—The nitride removal rate enhancer acts as a SiN rate enhancer. The rate & selectivity enhancement of SiN is further magnified due to the synergistic effect of i) & ii) arising due to the simultaneous presence of both the anionic abrasive and enhancer.

iii) Composition Stability in acidic pH—Colloidal silica is known to have stability issues (with time) in the 3-6 pH range due to the Zeta potential being near to zero (typical range is within ±15 mV). However, anionic silica has Zeta potential much farther away from zero (typical range is −20 mV to −60 mV) and remains a stable colloidal dispersion in the entire acidic pH regime. Therefore, the inventive composition containing anionic silica is also stable within the entire operating pH range of 2 to 6.5. This unique stability behavior is not shown by any of the prior art due to the abrasive being non-ionic or cationic in the prior art.

The nitride removal rate enhancers and anionic abrasives alone do not display this unique behavior. Also, currently available slurries might use non-ionic colloidal silica or a cationic abrasive in combination with acid, and thus none of these slurries display unique properties as stated in i), ii) and iii), and displayed by this disclosure. As used in the present disclosure, the term "nitride removal rate enhancer" indicates a compound that comprises a carboxyl or carboxylate group.

The polishing compositions and concentrates discussed in this disclosure contrast with currently available contemporary slurries in providing performance sustenance on current generation integrated circuit substrates whereas, simultaneously displaying marked advantages for next generation substrates and integration schemes. The composition of the present disclosure can successfully and efficiently remove silicon nitride layers with very high selectivity over the oxide layers. This composition can be used for reverse STI processes, clearing etch stop layers, hard masks and many other semiconductor processing applications wherein a relatively high silicon nitride MRR and concomitant almost no MRR on silicon oxide (stop on oxide) layer is required. Furthermore, the composition of the present disclosure can stop on Ta/TaN or low k/ultra-low k dielectric (SiCOH) films, a feature which will enable polishing other barrier metals while stopping on Ta/TaN or SiCOH layers for many new integration schemes.

Thus, in one embodiment, the present disclosure provides a polishing composition. The composition comprises an anionic abrasive, a nitride removal rate enhancer comprising a carboxylic acid or a carboxyl/carboxylate group for increasing silicon nitride rates, water, and optionally, an anionic polymer. The polishing composition has a pH of about 2 to about 6.5.

In another embodiment, the present disclosure provides a polishing method, comprising applying a polishing composition to a substrate having silicon nitride on its surface, and removing at least a portion of the silicon nitride from the substrate at a first rate, by bringing a pad into contact with the substrate and moving the pad in relation to the substrate. The composition comprises an anionic abrasive, a nitride removal rate enhancer comprising a carboxylic acid or a carboxyl/carboxylate group for increasing silicon nitride rates, water, and optionally, an anionic polymer. The polishing composition has a pH of about 2 to about 6.5.

Thus, in one embodiment, the present disclosure provides a polishing composition that polishes silicon nitride with high selectivity over the oxide layers. The embodiment also provides the method of using the same. The polishing composition comprises an anionic abrasive, a nitride removal rate enhancer, pH adjustor, water and/or anionic polymer. The pH of the polishing composition is approximately from 2.0 to 6.5. The embodiment also provides polishing methods of using the same.

In another embodiment, the present disclosure provides a polishing composition having a broad pH operation range where silicon nitride is polished with high selectivity over the oxide. This embodiment also provides the polishing method of using the same. The polishing composition comprises an anionic abrasive, a nitride removal rate enhancer, pH adjustor, water and/or anionic polymer. The pH of the polishing composition is 2.0 to 6.5.

In yet another embodiment, the present disclosure provides a polishing composition having a long shelf life, with respect to the usable time period and/or expiration date of the composition. Particularly, the mean particle size (MPS, measured by Malvern tool) is stable for about a year or longer. In other words, item iii) discussed above, a composition stability in acidic pH is covered by this embodiment.

In another embodiment, the present disclosure provides a polishing composition having a novel P*V (Pressure*Velocity) response property, wherein a silicon nitride layer of the substrate to be polished exhibits Prestonian behavior while an oxide layer exhibits Non-Prestonian behavior. This embodiment covers and confirms items i) Beneficial Charge Interactions, and ii) SiN rate and selectivity Enhancement.

In another embodiment, the present disclosure provides a polishing composition that can polish silicon nitride with a high selectivity over the silicon oxide, and produce oxide with very low defectivity post polishing. The embodiment also provides the polishing method of using the same.

In another embodiment, the present disclosure provides a polishing composition that can be used for other metal CMP applications, including Co, Cu, W, Ta, TaN or a combination thereof.

In yet another embodiment, the compositions of the present disclosure can be diluted at the point of use (POU) (i.e., before going on the polishing tool) without changing the CMP performance. For example, the concentrated polishing composition can be 2× of POU. When CMP is performed by diluting the 2× with water, to reach other chemicals' concentration at POU of 1× formulated slurry, there is no deterioration in performance of the concentrate formulation (2×) versus the diluted formulation (1×). More concentrated polishing compositions might be prepared using similar methodology.

DETAILED DESCRIPTION OF THE DISCLOSURE

Figure 1:
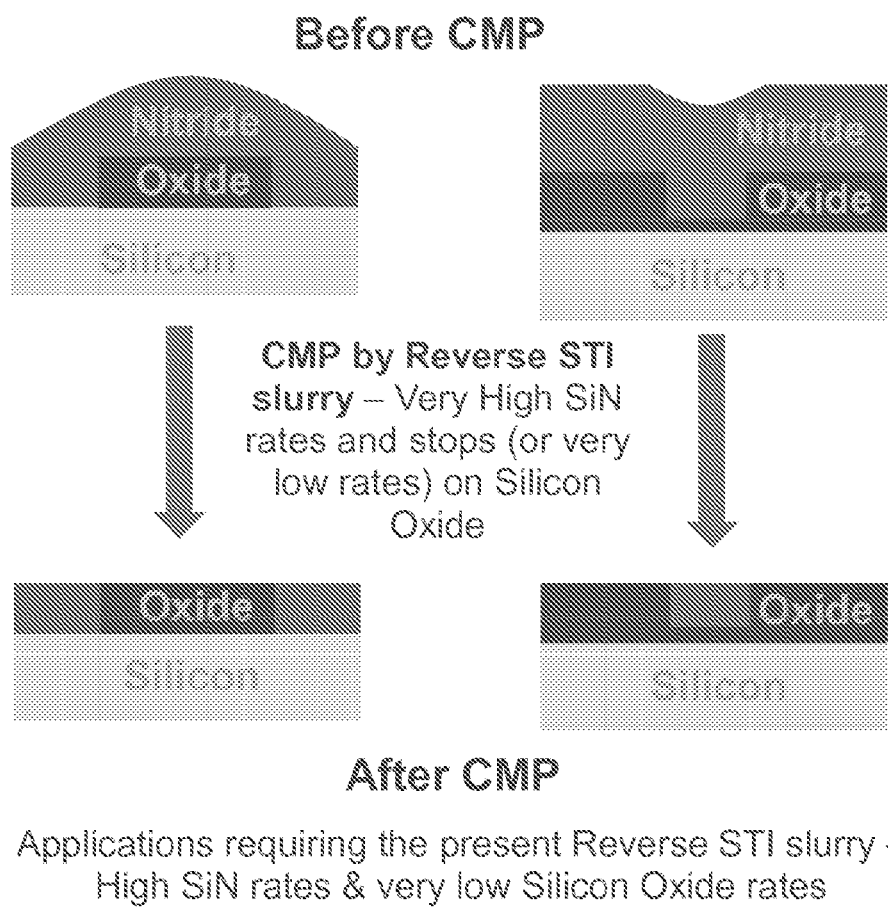
FIG. 1 is a schematic diagram of Reverse STI polishing applications that require selective polishing of SiN at very high rates and simultaneous low rates of silicon oxide. The reverse STI composition presented in this disclosure would be used in these and related applications.

The present disclosure provides polishing compositions as well as methods of polishing substrates using the same. The polishing composition comprises (a) an anionic abrasive, (b) a nitride removal rate enhancer, (c) water, and, optionally, (d) an anionic polymer. The polishing composition can have a pH of about 2 to about 6.5. The polishing composition of the present disclosure has a high selectivity of polishing silicon nitride over silicon oxide films during the CMP of substrates comprising silicon nitride and silicon oxide. The compositions of the present disclosure can also be diluted without sacrificing performance. The present disclosure also provides a polishing method (CMP) of using the polishing composition to polish semiconductor substrates. Particularly, the present disclosure provides a method for polishing silicon nitride with high selectivity to silicon oxide. The polishing composition can also be used for applications that need to polish cobalt, copper, or other metals, and other dielectric films such as polycrystalline silicon and low k/ultra-low k dielectric (SiCOH) films.

The polishing composition comprises an anionic abrasive. Anionic abrasives are colloidal abrasives that have been imparted with a negative charge and show negative potential values (in mV) in Zeta Potential plots. Non-ionic abrasives are modified into anionic abrasives by attaching anionic groups to some of the abrasive grains. This modification to produce an anionic abrasive may be by chemical bonding or by physically forming self-assembled multiple monolayers on top of the silica grains, or by physical adsorption of the anionic groups on the surface of silica grains.

The preferred method to form the anionic abrasive is with chemical bonding and it is typically done by reacting the abrasive with a compound of generic formulation

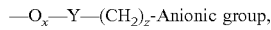
—$O_x$—Y—$(CH_2)_z$-Anionic group, wherein the x and z integer values can vary, and Y is either alumina, silica, titania, ceria, zirconia, co-formed products thereof, or mixtures thereof (depending on the type of abrasive). The "Anionic group" may be an acid such as sulfonic acid, phosphoric acid, carboxylic acid, or anionic salts of any of these acids. Commercial anionic abrasives are available from the following vendors—anionic ceria from Solvay of Belgium, anionic alumina from Evonik Industries of Germany, and anionic silica from Fuso Chemical Co., Ltd. of Japan. In the present disclosure, "anionic abrasive" is used to mean negatively-charged abrasives. These include the afore-mentioned commercially available anionic abrasives. They also include in-house chemical modification of non-ionic abrasives by anionic groups (such as acid immobilization), physical modifications by multiple monolayer formation or physical surface adsorption, or any other suitable methods to impart the desired negative charge. These negatively charged abrasives are used in the present polishing compositions with a plurality of chemicals, to obtain very high and selective SiN removal rates versus other dielectric materials.

One way to measure the charge of the anionic abrasives is with Zeta Potential. In colloidal systems, Zeta Potential is defined as the potential difference between the liquid dispersion medium, and the stationary layer of fluid attached to the dispersed colloidal particle. The Zeta Potential of solutions can be measured by commercially available tools such as the AcoustoSizer II made by Colloidal Dynamics, or Malvern Instruments tools that work by dynamic light scattering. The Zeta Potential is particularly useful in determining colloidal dispersion stability. A general guideline would be as follows:

| Zeta Potential (mV) | Stability (with time) of Colloidal Dispersion |
|---|---|
| from 0 to ±5 | Immediate coagulation, gelling and settling |
| from ±5 to ±15 | Less stable |
| from ±15 to ±30 | Moderately stable |
| from ±30 to ±60 | Good stability |
| More than ±60 | Excellent stability |

Furthermore, Zeta potential is related to particle surface charge. Negative zeta potential indicates that the particle surface is negatively charged (anionic) in the dispersion, and vice versa for cationic abrasive (positively charged). In order to maintain the stability of particle dispersion, it is preferred that the absolute value of zeta potential is larger than at least 10 mV (see table). In this invention, it is preferred that the anionic abrasive has a zeta potential in the range of 0 to ±100 mV, more preferably, about −10 mV to −100 mV, and most preferred of −15 mV to −70 mV. Furthermore, it is preferred that the composition has a zeta potential in the range of ±5 mV to ±100 mV, more preferably, about −10 mV to −100 mV, and most preferred of −15 mV to −70 mV.

The charge of the composition can also be measured by its conductivity. The polishing composition can have a conductivity in the preferred range of 0.1 to 10 milli-Siemens per centimeter (mS/cm), or any subranges therebetween, or 0.5 to 5 mS/cm, or any subranges therebetween.

The anionic abrasive may be present in an amount of from 0.01 wt % to 30 wt %, based on the total weight of the composition, from 0.05 wt % to 15 wt %, based on the total weight of the composition, from 0.1 wt % to 10 wt %, based on the total weight of the composition, or any subranges therebetween.

The polishing composition of the present disclosure, in addition to anionic abrasives, has a nitride removal rate enhancer which, as discussed above, comprises a carboxyl group or a carboxylate group or ion. Suitable nitride removal rate enhancers include carboxylic acids such as formic acid, acetic acid, malonic acid, citric acid, propionic acid, malic acid, adipic acid, succinic acid, lactic acid, or any combinations thereof. Other suitable nitride removal rate enhancers that are not necessarily carboxylic acids include potassium acetate, potassium citrate, amino acetic acid, phenoxyacetic acid, tetrahydrofurancarboxylic acid, diglycolic acid, glyceric acid, tricine, benzoic acid, or any combinations thereof.

The nitride removal rate enhancer may be present in an amount of from 0.01 wt % to 10 wt %, based on the total weight of the composition, from 0.01 wt % to 5 wt %, based on the total weight of the composition, from 0.03 wt % to 3 wt %, based on the total weight of the composition, or any subranges therebetween.

The polishing composition may optionally contain an anionic polymer. The anionic polymer can help in dielectric surface passivation and reducing defectivity post polishing. The anionic polymer is preferably sulfonate (—$SO_3^-$) based or phosphate based (—$PO_4^{3-}$) and contains hydrocarbon groups. In one embodiment, the anionic polymer is an anionic surfactant. Some examples of sulfonate/sulfate based anionic surfactants are lauryl ether sulfate, and sulfate based Triton surfactants from Dow Chemical such as TRITON Q-15, XN-455, and W-30 series. Some examples of phosphate based anionic surfactants/polymers are the Triton series from Dow Chemical such as TRITON H-55, and H-66.

When present, the anionic polymer may be present in an amount of from 1 ppm to 5 wt %, based on the total weight of the composition, from 1 ppm to 10000 ppm, based on the total weight of the composition, from 1 ppm to 2000 ppm, based on the total weight of the composition, or any subranges therebetween.

In addition to the above components, the polishing composition can have a base acting as a pH adjustor. The base pH adjustor helps in taking the composition pH to its operating pH value. The base used to adjust the pH can be any suitable one, such as potassium hydroxide, ammonium hydroxide, sodium hydroxide, cesium hydroxide, triethanol ammine, tetrabutyl ammonium hydroxide, tetramethyl ammonium hydroxide, or any combinations thereof.

The pH of the composition of the present disclosure can be from 2.0 to 6.5, or any subranges therebetween. The pH can also be from 3.0 to 6.0, or any subranges therebetween, or from 3.4 to 5.75, or any subranges therebetween. The pH can be measured using a pH meter from the company Thermo Fisher Scientific.

With respect to the particle sizes of the claimed anionic abrasives, they can have a mean particle size of about 1 nm to 1000 nm, more preferably about 1 nm to 200 nm, and most preferred of about 1 nm to 50 nm, or any subranges thereof. A smaller particle size has the advantage of preferentially giving lower TEOS MRRs, and thus improving the overall selectivity of SiN to TEOS. Particle size in this disclosure is the mean particle size (MPS) determined by dynamic light scattering techniques. For instance, the mean particle size can be measured by using a Malvern, a commercial dynamic light scattering tool from Malvern Instruments Ltd.

In the discussion above and in the following examples, the compositions of the present disclosure are discussed in combination with polishing SiN, silicon nitride. However, present compositions might also be used to polish silicon carbide (SiC), silicon carbide nitride ($SiC_xN_y$), polysilicon, and other nitride containing materials selectively over silicon oxides (e.g., TEOS). The compositions may also be used to selectively polish SiN over silicon oxide containing dielectric materials such as low-k dielectric ($SiC_xO_yH_z$), and ultra-low k (ULK) dielectric ($SiC_xO_yH_z$) materials. Some common examples of low-k and ULK dielectric materials are Black Diamond I and II, respectively, from Applied Materials.

EXAMPLES

Examples are provided to further illustrate the capabilities of the polishing compositions and methods of the present disclosure. The provided examples are not intended and should not be construed to limit the scope of the present disclosure.

Example 1

This example demonstrates the effect of desired additives for enhancing silicon nitride material removal rates.

In this example, the polishing composition primarily comprises 1 wt % anionic abrasive, several acids as nitride removal rate enhancers, potassium hydroxide as pH adjustor, and water as a liquid carrier. The control sample in Table 1 doesn't have acid, whilst others have the same molar amount of the acid additive. For all examples, an Applied Materials Mirra CMP polisher was used with a downforce of 3 psi and a flow rate of 175 mL/min to polish 8 inch silicon nitride and silicon oxide wafers.

TABLE 1

Normalized Removal Rate vs. Different Additives

| Sample | Acid | POU Anionic Abrasives Wt % | Normalized SiN RR | Normalized TEOS RR | SiN: TEOS |
|---|---|---|---|---|---|
| Control | None | 1 | 1.000 | 0.063 | 16 |
| 1A | Nitric acid | 1 | 5.716 | 0.867 | 7 |

TABLE 1-continued

Normalized Removal Rate vs. Different Additives

| Sample | Acid | POU Anionic Abrasives Wt % | Normalized SiN RR | Normalized TEOS RR | SiN: TEOS |
|---|---|---|---|---|---|
| 1B | Acetic Acid | 1 | 11.182 | 0.630 | 18 |
| 1C | Propionic acid | 1 | 10.966 | 0.114 | 97 |
| 1D | Malonic acid | 1 | 8.920 | 0.713 | 13 |
| 1E | Dequest 2010 | 1 | 3.125 | 0.351 | 9 |
| 1F | $H_2SO_4$ | 1 | 4.619 | 0.664 | 7 |

The results in Table 1 showed that silicon nitride RR is low without adding an acid into the polishing composition (see Control). An acid with a carboxyl group, such as acetic acid, propionic acid, or malonic acid significantly increased silicon nitride RR to about 8 to 11 times the Control (without the rate enhancer additive). Other acids without a carboxyl group, such as nitric acid or phosphoric acid, also increase silicon nitride removal rate, but not as effectively as that of an additive with a carboxyl group. The silicon oxide (in this example, TEOS) RR is less than 40 A/min for all the samples in table 1, and near to 0 A/min for most cases. This very low oxide RR on TEOS was achieved because the abrasive has small particle size and has anionic surface charge, so the TEOS repels the anionic abrasive and gives low MRRs. Thus, the synergistic effect of combining anionic abrasive with selective carboxylate containing nitride rate enhancer molecules leads to a highly selective SiN (to TEOS) composition displaying high SiN RR and very low TEOS rates.

Example 2

This example demonstrates how the composition of the present disclosure operates across a broad pH range.

TABLE 2

Normalized Removal Rate vs. Different pH

| Abrasive Type | Sample | pH | POU Abrasives wt-% | Normalized SiN RR | Normalized TEOS RR |
|---|---|---|---|---|---|
| Anionic abrasive | 2A | 3.41 | 1 | 11.854 | 0.068 |
| | 2B | 4 | 1 | 12.466 | 0.386 |
| | 2C | 4.5 | 1 | 12.474 | 0.049 |
| | 2D | 4.75 | 1 | 12.386 | 0.111 |
| | 2E | 5 | 1 | 12.459 | 0.136 |
| | 2F | 5.25 | 1 | 12.278 | 0.085 |
| | 2G | 5.5 | 1 | 11.988 | 0.025 |
| | 2H | 5.75 | 1 | 9.926 | 0.249 |
| | 2I | 6 | 1 | 7.366 | 0.036 |

The polishing composition in table 2 comprises 1% anionic abrasive, and nitride removal s rate enhancer. Potassium hydroxide was used to adjust the pH to the operating pH shown in Table 2. For all examples, an Applied Materials' Mirra CMP polisher was used with a downforce of 3 psi and a flow rate of 175 mL/min to polish 8 inch silicon nitride and silicon oxide wafers.

As shown in table 2, high silicon nitride RR, around the maximum of ~12 (Normalized) with very low Oxide RR of <0.386 (Normalized) were obtained for the pH range of 3.4 to 5.5 for the optimized inventive composition. Silicon nitride RR has ~16% reduction after increasing pH to 5.75. Further increase in pH to 6 will cause more reduction in silicon nitride MRRs. The polishing composition in this example showed much broader pH operation range of ~3 to 5.75 for achieving high silicon nitride RR and low oxide RR. By contrast, in one example of an available slurry in U.S. Pat. No. 7,217,989, all examples showed narrow pH operation range of 4.5 to 5.0 for achieving high silicon nitride RR. Below or above the pH range of 4.5 to 5.0, silicon nitride MRRs drop more than 30%.

Figure 2:
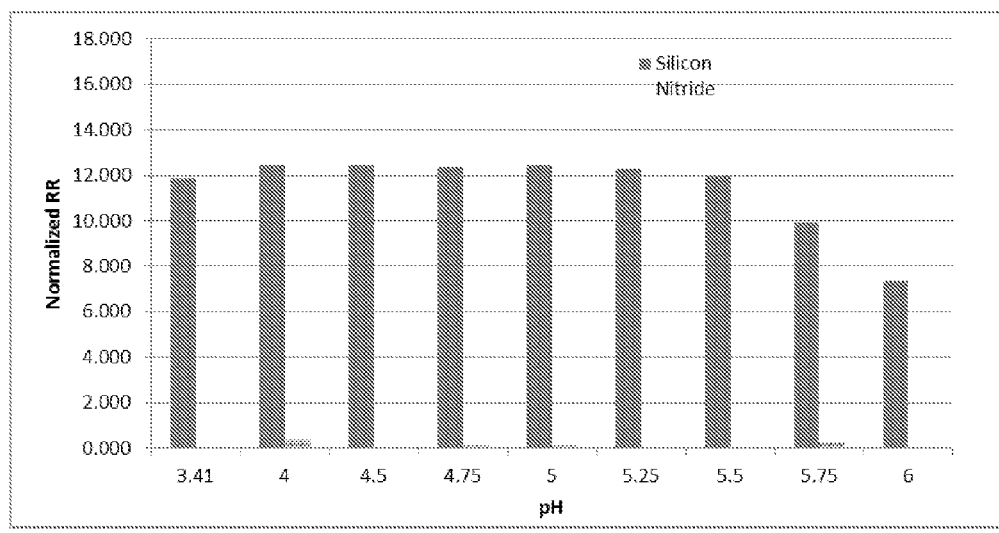
FIG. 2 is a graph showing a broad pH range of operation for the polishing compositions of the present disclosure, with high selectivity of silicon nitride over silicon oxide.

In this Example, the present disclosure clearly shows the novelty of the present composition in being capable of polishing silicon nitride films at very high rates over a broad pH processing/operating window (FIG. 2). The prior art does not reveal a composition that is capable of doing so. This performance of the polishing compositions in the disclosure might be associated with the relatively similar (fixed value) negative zeta potential of anionic modified particles over a wide pH range, which provides similar electrostatic attractive forces to the silicon nitride wafers (which have positive zeta potential), and thus maintains a similar silicon nitride RR over the entire acidic pH range. This unique behavior is again coming from the synergistic action of the anionic abrasive in combination with the nitride removal rate enhancer. This behavior contrasts with prior art, wherein (normal) non-ionic silica particles are used and as pH decreases in acidic pH regime, the zeta potential is less negative or more positive for non-ionic silica, which provides a decreasing electrostatic attractive forces, or even repulsion forces to the silicon nitride wafer surface (which has positive charge), and thereby causes the silicon nitride CMP removal rates reduction.

To further elaborate, anionic abrasives have a relatively fixed constant negative zeta potential value over the entire 3-10 pH range. Typically, the fixed value may be any number in between −20 mV to −70 mV depending on the type and size of abrasive. For example, an anionic alumina abrasive might have a fixed −35 mV zeta potential value for the entire 3-10 pH range. However, for non-ionic abrasives (used in prior art), the zeta potential value is very different at different pH values in the acidic pH range. For, e.g., colloidal silica has a zeta potential value of +10 mV at pH 3, 0 mV at pH 4, and −10 mV at pH 5. So, conversely, not only does the SiN RR become inconsistent due to unfavorable electrostatic forces at different pH values for non-ionic silica (prior art); this different zeta potential value at very narrow pH interims also leads to slurry stability issues (shelf life/expiration date) with time. The unique zeta potential behavior and its consequence on composition stability are discussed further in the composition stability section (Example 3 below).

Example 3

This example shows the effect of anionic silica on the stability of the polishing compositions. In the semiconductor fabrication community, it is well known that CMP compositions should be stable/usable over time. Inasmuch, the compositions should have an expiration date of at least 6 months to a year at the very least. Instability in CMP compositions can be gauged by an increase in the Mean Particle Size (MPS) of the abrasive grains used in the composition. If there is a growth in abrasive MPS with time, it means that the composition is unstable. This growth in MPS primarily occurs due to the composition containing the abrasive not being a stable colloidal dispersion. Colloidal stability is seen in zeta potential plots of the slurries, wherein, if any composition has zeta potential values within the ±10 mV range, it is considered unstable and characterized by a growth in MPS with time due to particles agglomerating. The synergistic use of anionic abrasive with nitride enhancer molecules increases composition stability and this example demonstrates the same.

In addition to composition shelf life issues arising from growth in MPS, the increase in mean particle size of the abrasives in the composition also causes increase in the defectivity and/or changes in RR during CMP. This therefore results in inconsistent planarization performance which is unacceptable from the customer point of view. Therefore, it is highly desirable that the polishing compositions show stable mean particle size over a prolonged time period.

In table 3, the polishing compositions comprise anionic silica and non-ionic (normal) silica, and both had the same MPS of normalized value of 100 at day 0 (Sample 3A & 3E). In the compositions in table 3, except for the silica abrasive (anionic vs. non-ionic), all other chemical compositions such as nitride enhancer and pH adjustor are the same. Table 3 clearly shows that the polishing composition comprising anionic silica abrasive showed stable MPS over 330 days whereas the polishing composition comprising non-ionic (normal) silica abrasive had an MPS increase of over 4 times in only 80 days (normalized MPS value of 436 after 80 days versus 100 at 0 days). Thus, the use of anionic modified silica provides long term MPS stability for the polishing compositions as shown in this example. This implies stable industrial compositions for slurries using anionic abrasives and long shelf-life/expiration dates.

TABLE 3

Mean particle size comparison of the polishing compositions

| Sample | Abrasive Type | Days in Storage | pH | Normalized MPS |
|---|---|---|---|---|
| 3A | Anionic silica | 0 | 5 | 100 |
| 3B | abrasive | 100 | 5 | 99.4 |
| 3C |  | 220 | 5 | 98.6 |
| 3D |  | 330 | 5 | 98.9 |
| 3E | Non-ionic (normal) | 0 | 5 | 100 |
| 3F | silica abrasive | 80 | 5 | 436 |

Figure 3:
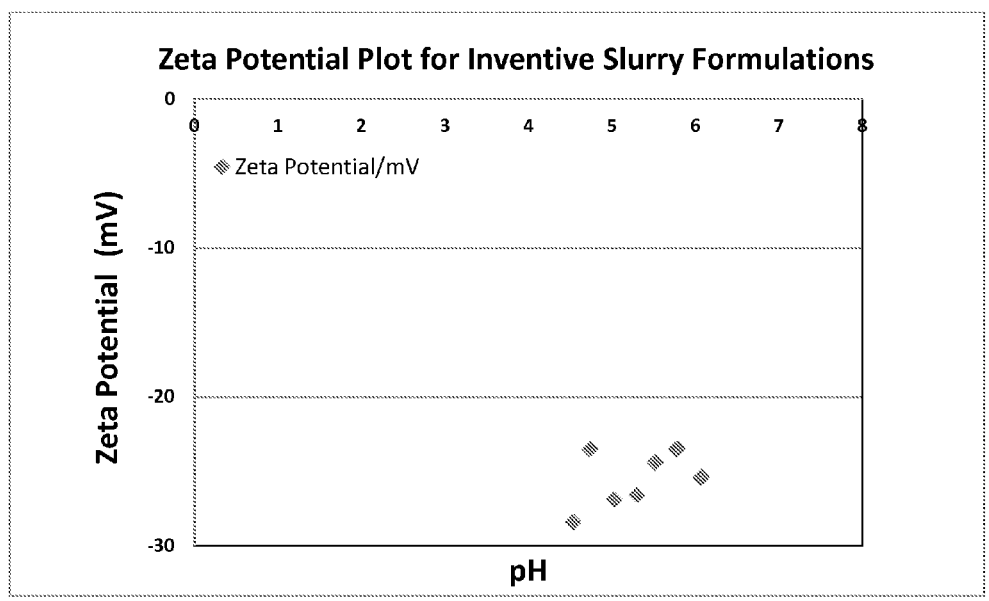
FIG. 3 is a Zeta Potential Plot for the compositions of the present disclosure.

A further gauge of stability is the zeta potential values of the slurries. FIG. 3 shows the zeta potential of the optimized inventive compositions. As can be seen from the Figure, the zeta potential of all slurries falls between −20 & −40 mV, clearly indicating that all these slurries are highly stable colloidal dispersions in the 2-7 pH range. Recall that the farther away from zero the zeta potential values are the more stable the dispersions are. As already stated, non-ionic (normal) silica containing dispersions in the acidic pH regime (pH 2 to 6) have zeta potential values within the ±10 mV range, indicating unstable compositions as was confirmed from the study shown in table 3 which shows MPS growth for such slurries.

Example 4

This example shows the impact of polishing pressure (P, psi) and velocity (V, RPM) on the silicon nitride and silicon oxide (e.g., TEOS) MRRs. The polishing composition comprises anionic abrasive, a nitride removal rate enhancer, a pH adjustor, and water. The optimized composition might also include an anionic surfactant. An Applied Materials RefleXion LK CMP polishing tool was used to polish silicon nitride and TEOS wafers at different polishing pressure (P) and velocity (V) by using the inventive polishing composition.

In a conventional CMP process, the fundamental equation describing Material Removal Rate is based on Preston's Law which states that Removal Rate (RR) is directly proportional to applied pressure (P—contact pressure between the substrate and polishing platen) and relative velocity (V—rotational speed/rpm of the platen) of the polishing platen.

$$RR=K_p(P*V)$$

where $K_p$ is the Preston's constant. In the language of the field, researchers typically call this as the classical PV dependence of MRRs in CMP. So, classical Prestonian CMP behavior implies that as Pressure or Velocity is increased, MRRs increase proportionally, and specifically the RR is dependent on the product of P*V. Therefore, if any composition could chemically remove any films by CMP, the MRRs observed during CMP could be further enhanced by increasing the P and V processing parameters. On the contrary, if any composition is incapable of chemically removing any films by CMP (nearly zero MRRs and stopping on a film), the RR of such slurries does not change appreciably even if the P and V are increased. This unique behavior is called Non-Prestonian behavior of CMP slurries and is very rare.

Figure 4:
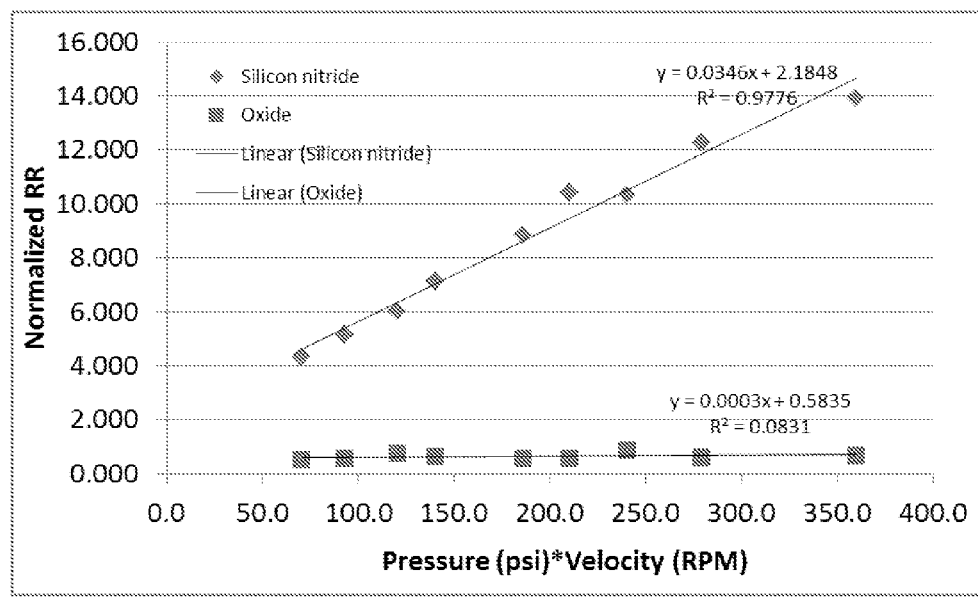
FIG. 4 shows P*V responses of the polishing composition of the present disclosure.

FIG. 4 shows this unique Non-Prestonian behavior of the present CMP composition on silicon oxide films. As can be seen in FIG. 4, silicon nitride RR showed linear response (Prestonian) to the polishing P*V process conditions with an $R^2$ value larger than 0.9; P*V almost had no impact on the silicon oxide RR (Non-Prestonian behavior) and the $R^2$ value is close to 0. This is a very novel property unique only to the composition disclosed in this disclosure. This confirms that the unique anionic abrasive plus chemicals package in the composition is not only achieving very high SiN MRRs; concomitantly it is also causing the composition to stop on Oxide—even with increase in Pressure/Velocity/Friction Oxide RR stays same ~0 (see FIG. 4). In all prior art, the oxide RR increases as the polishing pressure (or velocity) increases. This non-prestonian response of oxide RR to polishing PV has many benefits in CMP. For instance, one of the issues reported in the prior art (Schlueter & Henry et. al. "High Selectivity Silicon Nitride Slurry for Advanced Technology Node Front End CMP Applications", 18*th* *International Symposium on Chemical-Mechanical Planarization*, Aug. 11-14, 2013, Lake Placid, N.Y., USA) is that the oxide RR on patterned wafers tend to be much higher than that on blanket wafer. The main contributor for this issue is that the oxide RR increases with increasing polishing pressure (downforce). Schlueter et al. reported that when their slurry was used to polish patterned wafers comprising both SiN and Oxide features, the smaller oxide features (in areas having very high SiN and very low oxide density in the pattern features) are under much higher local pressure, and therefore showed much higher oxide RR and consequently much lower selectivity to SiN films. Therefore, if a polishing composition had very low oxide RR (near to zero), and the oxide RR were not sensitive to polishing pressure/downforce, this could solve the oxide RR increase issue on pattern wafers. The inventive polishing composition of this disclosure would certainly meet the critical requirement of achieving low oxide RR and high silicon nitride RR on patterned wafers, and thus to maintain the high selectivity of silicon nitride RR to oxide RR, as elucidated by this example.

Example 5

Defectivity is an important parameter during the chip manufacturing process, and it is preferred to have very low defectivity in every step of CMP so as to have high yield of chip dies. Specifically, for applications involving polishing silicon nitride and oxide with high selectivity, it is preferred that the defectivity on the oxide layer is low because in most applications all of the nitride is removed and the polishing stops as soon as the oxide layer is revealed. The example here demonstrates polishing compositions with high selectivity of silicon nitride to oxide, and very low oxide defectivity post polishing.

In table 4, the polishing composition primarily comprises anionic abrasive particles and nitride removal rate enhancer. As stated earlier, some of the inventive compositions optionally contain an anionic polymeric surfactant molecule. The surfactant can help to reduce defectivity, and the data in Table 4 make this function of the anionic surfactant more apparent. For instance, 4B and 4C contain anionic surfactant molecules and have lesser defectivity than the 4A composition that does not contain any surfactants. Furthermore, all the inventive compositions have lesser defectivity values than our commercial copper barrier composition (see Table 4). For all examples, an Applied Materials Mirra CMP polisher was used with a downforce of 3 psi and a flow rate of 175 mL/min to polish 8 inch silicon nitride and oxide wafers.

TABLE 4

Wafer Defectivity Vs. Polishing Compositions

| Sample | Anionic Surfactant | Normalized Silicon Nitride RR | Normalized Silicon Oxide RR | Defectivity |
| --- | --- | --- | --- | --- |
| 4A | NO | 11.779 | 0.265 | 60 |
| 4B | Yes | 11.451 | 0.358 | 34 |
| 4C | Yes | 11.563 | 0.545 | 26 |
| Commercial Slurry | Yes | 4.545 | 18.182 | 100~200 |

The ultra-low defectivity on silicon oxide for the inventive compositions might be attributed (in part) to the ultra-low oxide polishing RR (<40 A/min) of these polishing compositions.

In one embodiment, the removal rates of SiN and silicon oxide or polysilicon can satisfy the following equations:

$$[1.5234*X-36](A/min) \leq \text{SiN removal rate} \leq [1.7858*X+226](A/min); \text{ and}$$

$$0 \leq \text{silicon oxide or polysilicon removal rate} \leq 100 \text{ A/min,}$$

wherein X=downforce (psi)*platen speed (RPM).

Example 6

This example shows that the inventive polishing compositions discussed in this disclosure can also be used for polishing other metals.

In table 5, the polishing composition primarily comprises an anionic abrasive, an agent with a carboxylate group for increasing silicon nitride RR, and optionally an anionic surfactant. For all examples, an Applied Materials Mirra CMP polisher was used with a downforce of 3 psi and a flow rate of 175 mL/min to polish 8 inch wafers of selected materials such as silicon nitride, silicon oxide (e.g., TEOS), Co, Cu, W, Ta, and TaN. Table 5 shows that the polishing compositions not only showed high selectivity of removing silicon nitride over silicon oxide, but also had very low removal RR on Ta and TaN (this attribute is desirable). The inventive polishing compositions also achieved very high Co RR, at times as high as 3000 A/min. Thus, the inventive polishing compositions can also be used for applications that need to polish silicon nitride or Co or both SiN and Co at very high polishing rates (and/or with high selectivity to oxide films).

TABLE 5

Metal Removal RR with Polishing Compositions

| Sample | Anionic Surfactant | Normalized RR | | | | | |
|---|---|---|---|---|---|---|---|
| | | Silicon nitride | Oxide | Co | Cu | W | Ta | TaN |
| 5A | No | 11.779 | 0.265 | 62.500 | 2.568 | 2.636 | 0.453 | 0.475 |
| 5B | Yes | 11.451 | 0.358 | 56.318 | 3.182 | 1.773 | 0.281 | 0.335 |

Example 7

This example demonstrates that the polishing composition can be prepared as concentrates, and then be diluted (with water) at the point of use (POU) for polishing without any deterioration in polishing performance. Typically, customers prefer slurry concentrates so as to reduce freight/shipping costs and have advantageous overall slurry pricing.

Table 6 shows polishing composition 6A and 6B, where 6B is the 2× concentrated version of 6A of each composition component except for water. For all examples, an Applied Materials Mirra CMP polisher was used with a downforce of 3 psi and a flow rate of 175 mL/min to polish 8 inch silicon nitride and TEOS wafers. The silicon nitride and silicon oxide (TEOS) RR from 6B after 2× dilution is almost the same as that of 6A. For people skilled in the art, a 3X or higher concentrated version can be prepared of the inventive composition using similar methodology.

TABLE 6

Concentrated vs. non-concentrated version

| Sample | Concentrated version | Normalized Silicon nitride RR | Normalized Silicon Oxide RR |
|---|---|---|---|
| 6A | No | 12.628 | 0.053 |
| 6B | 2X | 12.556 | 0.025 |

While the present disclosure has been described with reference to one or more exemplary embodiments, it will be understood by those skilled in the art that various changes may be made and equivalents may be substituted for elements thereof without departing from the scope of the present disclosure. Variations of the preferred embodiments mentioned herein may become apparent to those of ordinary skill in the art upon reading the foregoing descriptions. In addition, many modifications may be made to adapt a particular situation or material to the teachings of the disclosure without departing from the scope thereof. Therefore, it is intended that the present disclosure not be limited to the particular embodiment(s) disclosed as the best mode contemplated, but that the disclosure will include all embodiments falling within the scope of the appended claims. Furthermore, the inventors expect skilled artisans to employ variations as appropriate to practice the disclosure in other forms than as specifically described herein. This includes all modifications and equivalents of the subject matter recited in the claims appended hereto as permitted by applicable law.

What is claimed is:

1. A polishing method, comprising:
applying a polishing composition to a substrate having silicon nitride and silicon oxide on its surface;
bringing a pad into contact with the substrate and composition and moving the pad in relation to the substrate;
removing at least a portion of the silicon nitride from the substrate at a first rate; and
removing at least a portion of the silicon oxide from the substrate at a second rate, wherein a ratio of said first rate to said second rate is 7 or higher, and wherein the composition comprises:
a) an anionic abrasive;
b) a nitride removal rate enhancer comprising a carboxylic acid or a carboxyl/carboxylate group for increasing silicon nitride rates;
c) water; and
(d) optionally, an anionic polymer;
wherein the polishing composition has a pH of about 2 to about 6.5.

2. The method of claim 1, wherein said first rate exhibits Prestonian behavior, and said second rate exhibits non-Prestonian behavior.

3. The method of claim 1, wherein said first rate and said second rate satisfy the following equations:

$$[1.5234*X-36](A/min) \leq \text{first rate} \leq [1.7858*X+226] (A/min); \text{ and}$$

$$0 \leq \text{second rate} \leq 100 \text{ A/min},$$

wherein X=downforce (psi)*platen speed (RPM).

4. The method of claim 1, wherein the anionic abrasive is selected from the group consisting of alumina, silica, titania, ceria, zirconia, co-formed products thereof, and mixtures thereof.

5. The method of claim 1, wherein the anionic abrasive is selected from the group consisting of anionic colloidal silica, acid immobilized non-ionic silica to generate anionic silica, and electrostatically negatively charged colloidal mixtures thereof.

6. The method of claim 1, wherein the mean particle size of the anionic abrasive is about 1 nm to 1000 nm.

7. The method of claim 1, wherein the mean particle size of the anionic abrasive is about 1 nm to 50 nm.

8. The method of claim 1, wherein the anionic abrasive has a zeta potential in the range of 0 to ±100 mV.

9. The method of claim 1, wherein the anionic abrasive has a zeta potential in the range of −15 mV to −70 mV.

10. The method of claim 1, wherein the polishing composition has a zeta potential in the range of ±5 mV to ±100 mV.

11. The method of claim 1, wherein the polishing composition has a zeta potential in the range of −15 mV to −70 mV.

12. The method of claim 1, wherein the composition has a conductivity in the range of 0.1 to 10 milli-Siemens per centimeter (mS/cm).

13. The method of claim 1, wherein the abrasive is present in the composition in the amount of 0.1 wt % to 30 wt %, based on the total weight of the composition.

14. The method of claim 1, wherein the nitride removal rate enhancer is selected from the group consisting of gluconic acid, lactic acid, citric acid, tartaric acid, malic acid, glycolic acid, malonic acid, formic acid, oxalic acid, acetic acid, propionic acid, peracetic acid, succinic acid, lactic acid, potassium acetate, potassium citrate, amino acetic acid, phenoxyacetic acid, tetrahydrofurancarboxylic acid, diglycolic acid, glyceric acid, tricine, histidine, tyrosine, benzoic acid, and any mixtures thereof.

15. The method of claim 14, wherein the anionic polymer is an anionic surfactant with an average molar mass of about 120 g/mol or greater.

16. The method of claim 15, wherein the anionic surfactant contains a sulfonate ($-SO_3$) moiety, a phosphate ($-PO_4$) moiety, hydrocarbon groups, or combinations thereof.

17. The method of claim 15, wherein the anionic surfactant is selected from the group consisting of an alkylbenzene sulfonic acid, an alkylbenzene sulfonate, an alkyl sulfate, an alkyl ether sulfate and any combinations thereof.

18. The method of claim 15, wherein the anionic surfactant is in the amount of 0.001 wt % to 5 wt %, based on the total weight of the composition.

19. The method of claim 1, wherein the nitride removal rate enhancer is present in the composition in an amount of 0.01 wt % to 20 wt %, based on the total weight of the composition.

20. The method of claim 1, wherein the nitride removal rate enhancer is present in the concentrate in an amount of 0.01 wt % to 3 wt %, based on the total weight of the composition.

21. The method of claim 1, wherein the anionic polymer is present.

22. The method of claim 1, further comprising a base as a pH adjustor, wherein the base is selected from the group consisting of potassium hydroxide, ammonium hydroxide, triethanol ammine, tetrabutyl ammonium hydroxide, tetramethyl ammonium hydroxide, sodium hydroxide, cesium hydroxide, and any combinations thereof.

23. A polishing method, comprising:
applying a polishing composition to a substrate having silicon nitride on its surface; and
removing at least a portion of the silicon nitride from the substrate at a first rate, by bringing a pad into contact with the substrate and moving the pad in relation to the substrate, wherein the composition comprises:
a) anionic abrasive is anionic colloidal alumina;
b) a nitride removal rate enhancer comprising a carboxylic acid or a carboxyl/carboxylate group for increasing silicon nitride rates;
c) water; and
(d) optionally, an anionic polymer;
wherein the polishing composition has a pH of about 2 to about 6.5.

24. A polishing method, comprising:
applying a polishing composition to a substrate having silicon nitride and silicon oxide on its surface; and
bringing a pad into contact with the substrate and composition and moving the pad in relation to the substrate;
removing at least a portion of the silicon nitride from the substrate at a first rate; and
removing at least a portion of the silicon oxide from the substrate at a second rate, wherein said first rate is higher than said second rate, and where said second rate is forty Angstroms per minute or lower, and wherein the composition comprises:
a) an anionic abrasive;
b) a nitride removal rate enhancer comprising a carboxylic acid or a carboxyl/carboxylate group for increasing silicon nitride rates;
c) water; and
(d) optionally, an anionic polymer;
wherein the polishing composition has a pH of about 2 to about 6.5.

* * * * *